(12) United States Patent
Bella et al.

(10) Patent No.: US 10,797,220 B2
(45) Date of Patent: Oct. 6, 2020

(54) SHAPE-CONTROLLED CERAMIC FILLERS FOR ENHANCED PIEZOELECTRIC PROPERTIES OF STRUCTURED COMPOSITES

(71) Applicant: SABIC Global Technologies B.V., Bergen op Zoom (NL)

(72) Inventors: Redha Bella, Thuwal (SA); Jesus Alfonso Caraveo Frescas, Thuwal (SA); Ibrahim Al-Howaish, Thuwal (SA); Nijesh K. James, Delft (NL); Sybrand Van Der Zwaag, Delft (NL); Jibran Khaliq, Delft (NL); Wilhelm A. Groen, Eindhoven (NL)

(73) Assignee: SABIC Global Technologies B.V., Bergen op Zoom (NL)

( * ) Notice: Subject to any disclaimer, the term of this patent is extended or adjusted under 35 U.S.C. 154(b) by 342 days.

(21) Appl. No.: 15/563,139

(22) PCT Filed: Mar. 30, 2016

(86) PCT No.: PCT/IB2016/051793
§ 371 (c)(1),
(2) Date: Sep. 29, 2017

(87) PCT Pub. No.: WO2016/157092
PCT Pub. Date: Oct. 6, 2016

(65) Prior Publication Data
US 2018/0083183 A1    Mar. 22, 2018

Related U.S. Application Data

(60) Provisional application No. 62/141,513, filed on Apr. 1, 2015.

(51) Int. Cl.
*H01L 41/187* (2006.01)
*C01G 33/00* (2006.01)
(Continued)

(52) U.S. Cl.
CPC ........ *H01L 41/1873* (2013.01); *C01G 33/006* (2013.01); *C04B 35/495* (2013.01);
(Continued)

(58) Field of Classification Search
CPC ... H01L 41/183; H01L 41/1873; H01L 41/37; C08K 7/00; C04B 35/495; C01G 33/006
See application file for complete search history.

(56) References Cited

U.S. PATENT DOCUMENTS

| 8,414,791 B2 | 4/2013 | Kaigawa et al. |
| 2014/0139070 A1 | 5/2014 | Yamazaki et al. |

FOREIGN PATENT DOCUMENTS

| EP | 2417063 | 7/2013 |
| JP | 5662197 | 1/2015 |

(Continued)

OTHER PUBLICATIONS

Jeong et al, "Large-Area and Flexible Lead-Free Nanocomposite Generator Using Alkaline Niobate Particles and Metal Nanorod Filler", Advanced Functional Materials, vol. 24, Issue 18, May 14, 2014, pp. 2620-2629.*

(Continued)

*Primary Examiner* — C Melissa Koslow
(74) *Attorney, Agent, or Firm* — Norton Rose Fulbright US LLP

(57) ABSTRACT

A lead-free lithium doped potassium sodium niobate piezoelectric ceramic material powdered form and having a single crystalline phase and uses thereof are described. Methods of making the said piezoelectric ceramic material are also described.

13 Claims, 11 Drawing Sheets

(51) Int. Cl.
H01L 41/37 (2013.01)
H01L 41/18 (2006.01)
C04B 35/495 (2006.01)
C08K 3/22 (2006.01)
C08K 7/00 (2006.01)

(52) U.S. Cl.
CPC .................. C08K 3/22 (2013.01); C08K 7/00 (2013.01); H01L 41/183 (2013.01); H01L 41/37 (2013.01); C01P 2002/34 (2013.01); C01P 2002/54 (2013.01); C01P 2002/72 (2013.01); C01P 2004/03 (2013.01); C01P 2004/38 (2013.01); C01P 2004/51 (2013.01); C01P 2004/62 (2013.01); C01P 2006/40 (2013.01); C04B 2235/3201 (2013.01); C04B 2235/3203 (2013.01); C04B 2235/786 (2013.01); C04B 2235/81 (2013.01); C08K 2201/001 (2013.01); C08K 2201/005 (2013.01); C08K 2201/019 (2013.01)

(56) References Cited

FOREIGN PATENT DOCUMENTS

| KR | 100790407 | 1/2008 |
|---|---|---|
| KR | 20090108423 | 10/2009 |
| WO | WO 2013/188380 | 12/2013 |

OTHER PUBLICATIONS

Babu et al., "Processing and characterization of piezoelectric 0-3 PZT/LCT/PA composites" *Journal of Physics D-Applied Physics*, 43:425402, (2010).
Bafandeh et al., "Improvement of piezoelectric and ferroelectric properties in (K, NA) NbO$_3$-based ceramics via microwave sintering," *J. Electroceramics*, 33:128-133, (2014).
Bomlai et al., "Effect of Calcination conditions and Excess Alkali Carbonate on the Phase Formation and Particle Morphology of Na$_{0.5}$K$_{0.5}$NbO$_3$ Powders," *Journal of the American Ceramic Society*, 90(5):1650-1655, (2007).
Bomlai et al., "Phase and morphology evolution of (Na$_{1-x}$K$_x$) NbO$_3$ powders related to calcination and K$_2$CO$_3$ contents," *J. Sci. Technol.*, 29(2): 441-448, (2007).
Chae et al., "Influence of calcination temperature on the piezoelectric properties of Ag$_2$O doped 0.94 (K$_{0.5}$NA$_{0.5}$)Nb)$_3$-0.06LiNbO$_3$ ceramics," *Ceramics International*, 39:S25-S29, (2013).
Gao et al., "(K, Na) NbO$_3$ based piezoceramics prepared by a two-step calcining and ball milling route" *Materials Letters*, 123:242-245, (2014).
Gupta et al., "Flexible High-Performance Lead-Free Na$_{0.47}$K$_{0.47}$Li$_{0.06}$NbO$_3$ Microcube-Structure-Based Piezoelectric Energy Harvester," *Applied Materials and Interfaces*, 8:1766-1773, (2016).
Hollenstein, "Preparation and Properties of KNbO$_3$-Based Piezoelectric Ceramics," Thèse No. 3856 (2007) École Polytechnique Fédérale De Lausanne Présentée le 31 août 2007 à la faculté des sciences et techniques de l'ingénieur Laboratoire de céramique programme doctoral en science et génie des matériaux.
Huang et al, "Influence of Calcined Temperature on the Piezoelectric Properties of (Na0.48K0.47Li0.05)NbO3 Lead-Free Piezoelectric Ceramics Doped with CuO," *Advanced Materials Research*, 760:763-766, (2013).
Huang et al., "Influence of calcined temperature and sintered technology on the properties of NBT-KBT-BT lead-free piezoelectric ceramics," *Piezoelectricity, Acoustic Waves and Device Applications (SPAWDA)*, (2011).
International Preliminary Report on Patentability issued in International Application No. PCT/IB2016/051793, dated Jun. 20, 2017.
James et al., "Piezoelectric and dielectric properties of polymer-ceramic composites for sensors," 2015, retrieved from the Internet URL: http://repository.tudelft.nl/islandora/object/unid:7923c925-d1a9-4ad7-aa58-3d6376dcc210/?collection=research (retrieved on May 30, 2016).
James et al., "Piezoelectric and mechanical properties of fatigue resistant, self-healing PZT-ionomer composites" *Smart Materials and Structures*, 23:055001, (2014).
James et al., "Piezoelectric and mechanical properties of structured PZT-epoxy composites" *Journal of Materials Research*, 28: 635-641, (2013).
Jeong et al., "Large-Area and Flexible Lead-Free Nanocomposite Generator Using Alkaline Niobate Particles and Metal Nanorod Filler," *Advanced Functional Materials*, 24:2620-2629, (2014).
Kakimoto et al., "Lead-free KNbO3 piezoceramics synthesized by pressure-less sintering," *Department of Materials Science and Engineering*, (2004).
Kato et al., "Lead-free Li-Modified (Na, K) NbO$_3$ piezoelectric ceramics fabricated by two-step sintering method," *Journal of Ceramic Society of Japan*, 122(6):460-463, (2014).
Khanbareh et al., "Effect of dielectrophoretic structuring on piezoelectric and pyroelectric properties of lead titanate-epoxy composites." *Smart Materials and Structures*, 23: 105030, (2014).
Klein et al., "A Study of the phase diagram of K, Na, Li)NbO$_3$ determined by dielectric and piezoelectric measurements, the Raman Spectroscopy," *Journal of Applied Physics*, 102:014112, (2007).
Le et al., "Preparation and characterization of lead-free (K$_{0.47}$Na$_{0.51}$Li$_{0.02}$)(Nb$_{0.8}$Ta$_{0.2}$)O$_3$ piezoceramic/epoxy composites with 0-3 connectivity," *Ceramics International*, 38S: S259-S262, (2012).
Lee et al., "Electrical properties of lead-free 0.98(Na$_{0.5}$K$_{0.5}$) NbO$_3$— 0.02BA(Zr$_{0.52}$Ti$_{0.48}$)O$_3$ piezoelectric ceramics by optimizing sintering temperature," *Nanoscale Research Letters*, 17:15, (2012).
Liou et al., "Pb(Mg$_{1/3}$Nb$_{2/3}$)O$_3$ Ceramics Produced by Modified Two-Stage Calcination Process," *Japanese Journal of Applied Physics*, 33:L1320-L1322, (1994).
Liu et al., "Depolarization temperature and piezoelectric properties of Na$_{1/2}$Bi$_{1/2}$TiO$_3$—Na$_{1/2}$Bi$_{1/2}$(Zn$_{1/3}$Nb$_{2/3}$)O$_3$ ceramics by two-stage calcination method," *Bulletin of Materials Science*, 30(6):579-581, (2007).
Luo et al., "Effects of the Calcining Temperature on the Piezoelectric and Dielectric Properties of the 0.55PNN-0.45PZT Ceramics," *Ferroelectrics*, 42, (2011).
Ma et al., "Alkaline niobate based lead-free ceramic fiber/polymer 1-3 composites: processing and electromechanical properties" *J Mater Sci: Mater Electron*, 22:1697-1702, (2011).
Mahesh et al., "Raman and Dielectric Studies on Lead free (K$_{0.5}$Na$_{0.5}$) NbO$_3$ Piezoelectric Ceramics," *Material Science and Engineering*, 73:012141, (2015).
Mascarenhas et al., "Master of Science Thesis Highly flexible lead-free piezoelectric composites for vibration damping and noise cancellation application," 2015, Retrieved from the Internet URL: http://repository.tudelft.nl/assets/uuid:d54fa42f-d731-443a-8178-73531f87ec74/Neola_Tressa_Mascarenhas_-2015-Highly_flexible_lead_free_piezoelectric_composite.pdf (retrieved on May 25, 2016).
Ray et al., "Excellent piezo-/pyro-/ferroelectric performance of Na$_{0.47}$K$_{0.47}$Li$_{0.06}$NbO$_3$ lead-free ceramic near polymorphic phase transition," *Scripta Materialia*, 99:77-80, (2015).
Rubio-Marcos et al., "Effect of the temperature on the synthesis of (K,NA) NbO$_3$-modified nanoparticles by a solid state reaction route," *Journal of Nanoparticle Research*, 12(7):2495-2502, (2010).
Sagong et al., "Poling flexible piezoelectric composites," *Ferroelectrics Letters Section*, 5:131-142, (1986).
Satish et al., "Study of piezoelectric and dielectric properties of ferroelectric PZT-polymer composites prepared by hot-press technique" *Journal of Physics D-Applied Physics*, 35: 2048-2050, (2002).
International Search Report and Written Opinion issued in International Application No. PCT/IB2016/051793, dated Jun. 8, 2016.
Senna et al., "Preparation of Phase-Pure K$_{0.5}$Na$_{0.5}$NbO$_3$ Fine Powders by a Solid-State Reaction at 625° C. from a Precursor Comprising Nb$_2$O$_5$ and K, Na Acetates" *Journal of the American Ceramic Society*, 97(2): (2013).
Seol et al., "Piezoelectric and dielectric properties of (K$_{0.44}$Na$_{0.52}$Li$_{0.04}$)(Nb$_{0.86}$Ta$_{0.10}$Sb$_{0.04}$)O$_3$-PVDF composites," *Ceramics International*, 38S: S263-266, (2012).

(56) References Cited

OTHER PUBLICATIONS

Shin et al., "Influence of calcination temperature on piezoelectric properties of $0.95(K_{0.52}Na_{0.48})NbO_3$—$0.05LiTaO_3$ lead-free piezoelectric ceramics." *Journal of the Korean Physical Society*, 61(6):942-946, (2012).

Tang et al., "Preparation and properties of $(K_{0.5}Na_{0.5})NbO_3$—$LiNbO_3$ ceramics." *Trans. Nonferrous Met. Soc. China*, 16: s466-s469, (2006).

Van den Ende et al., "Improving the $d_{33}$ and $g_{33}$ properties of 0-3 piezoelectric composites by dielectrophoresis," *Journal of Applied Physics*, 107: 024107, (2010).

Van den Ende et al., "Piezoelectric and mechanical properties of novel composites of PZT and a liquid crystalline thermosetting resin," *Journal of Materials Science*, 42: 6417-6425, (2007).

Venkatragavaraj et al., "Piezoelectric properties of ferroelectric PZT-polymer composites" *Journal of Physics D-Applied Physics*, 34:487-492, (2001).

Wang et al., "Enhanced piezoelectric properties of $(Ba_{0.85}Ca_{0.15})(Ti_{0.9}Zr_{0.1})O_3$ lead-free ceramics by optimizing calcination and sintering temperature," *Journal of the European Ceramic Society*, 31(11):2005-2012, (2011).

Wang et al., "Sol-gel synthesis and characterization of lead-free LNKN nanocrystalline powder," *Journal of Crystal Growth*, 310:4635-4639, (2008).

Written Opinion issued in International Application No. PCT/IB2016/051793, dated Feb. 24, 2017.

Yamada et al., "Piezoelectricity of a high-content lead zirconate titanate/polymer composite" *Journal of Applied Physics*, 53: 4328-4332, (1982).

Zheng et al., "Enhanced piezoelectricity over a wide sintering temperature (400-1050° C.) range in potassium sodium niobate-based ceramics by two step sintering," *Journal of Materials Chemistry A*, 13, (2015).

Zhang et al., "Lead-free piezoelectric composites with high piezoelectric performance and high dielectric constant caused by percolation phenomenon" *J Mater Sci: Mater Electron*, 25:4225-4229, (2014).

Communication pursuant to Article 94(3) EPC for EP16716288.2, dated Feb. 26, 2019.

Rai et al., "Development of lead-free materials for piezoelectric energy harvesting", *Mater. Res. Soc. Symp. Proc.* 1325, 2011, 105-110.

Feizpour et al., "Microwave-assisted synthesis and sintering of potassium sodium niobate lead-free piezoelectric ceramics," *Ceramics International*, 40:871-877, (2014).

Gaur et al., "Effect of sintering parameters on the electrical and the piezoelectricproperties of double-calcined $(K_{0.48}Na_{0.48}Li_{0.04})(Nb_{0.96}Sb_{0.04})O_3$ nanopowders," *Journal of the Korean Physical Society*, 2015, 66(5):800-805.

\* cited by examiner

SHAPE-CONTROLLED CERAMIC FILLERS FOR ENHANCED PIEZOELECTRIC PROPERTIES OF STRUCTURED COMPOSITES

CROSS REFERENCE TO RELATED APPLICATIONS

This application is a national phase application under 35 U.S.C. § 371 of International Application No. PCT/IB2016/051793 filed Mar. 30, 2016, which claims the benefit of priority of U.S. Provisional Patent Application No. 62/141,513, filed Apr. 1, 2015. The entire contents of each of the above-referenced disclosures are specifically incorporated herein by reference without disclaimer.

BACKGROUND OF THE INVENTION

A. Field of the Invention

The invention generally concerns lead-free lithium doped potassium sodium niobate piezoelectric particles that have a single crystalline phase. A two-staged calcination processes for making these single crystalline phase particles is also disclosed.

B. Description of Related Art

Piezoelectric materials are used in several components of medical diagnostic tools, industrial automation processes, and defense and communication systems. Such materials also find use in emerging fields such as micromotors, energy harvesting devices, magneto electric sensors and high power transformers.

Piezoelectrical properties can be found in several types of materials and engineered ceramics. For instance, lead zirconate titanate (PZT) ceramics have good piezoelectric properties and flexibility in terms of compositional modifications to fine tune the properties depending on a given applications. The presence of large amounts of lead (60 wt. % of lead oxide (PbO)) in PZT materials has, however, led to much attention during the past decade due to environmental concerns as well as governmental regulations against hazardous substances such as lead. Extensive research has since been conducted on the development of lead-free piezoelectric materials with high piezoelectric coefficient and electromechanical coupling factor. Among various possible material choices, most widely investigated lead-free systems are $K_{1-x}Na_xNbO_3$ (KNN), $Na_{0.05}Bi_{0.5}TiO_3$ (BNT) and $BaTiO_3$ (BT) based materials.

With respect to KNN ceramics, the crystal structure and piezoelectric and dielectric properties of these ceramics near x=0.5 compositions have been studied by many groups. The composition near x=0.5 is of interest because of its piezoelectric and dielectric properties, which has been attributed to the presence of a polymorphic phase boundary between two orthorhombic phases. Still further, the use of dopants on both the A and B sites has been used to improve the piezoelectric properties of KNN. In one instance, for example, Li doped KNN $(K,Na)_xLi_{1-x}NbO_3$ (hereafter referred as, LiKNN) ceramics have shown a significant improvement in properties ($d_{33}$-235 pC/N) at the phase boundary of orthogonal and tetragonal crystal structures within the range of 0.05<x<0.07. However, these bi-phasic LiKNN crystalline ceramics have not performed in a comparable manner with PZT-based ceramics.

SUMMARY OF THE INVENTION

A discovery has been made by the inventors that further improves the piezoelectric properties of LiKNN ceramic powders. In particular, the solution resides in the production of a lead-free lithium doped potassium sodium niobate piezoelectric powder that has a single crystalline phase with well-defined particle size and morphology. Without wishing to be bound by theory, it is believed that at least one or both of these features contribute to the ceramic's improved piezoelectric properties and allows the ceramic to be a commercially viable alternative to PZT-based ceramics. These structural features can be obtained by using a two-stage calcination process. It is believed that the first stage forms the single phase crystal structure such that secondary crystalline phases are not present. The second stage, which has a lower temperature and longer processing time than the first stage, contributes to the particle size and morphology of the ceramic powder of the present invention.

In one aspect of the present invention there is disclosed a lead-free lithium doped potassium sodium niobate piezoelectric ceramic material in powdered form and having a single crystalline phase. The ceramic material can have a formula of $(K,Na)_{1-x}Li_xNbO_3)$. In particularly preferred instances, x can be 0.05<x<0.07. The powdered single crystalline phase ceramic material can have a substantially cubical particle morphology. The ceramic material can be characterized by a powder x-ray diffraction pattern as substantially depicted in FIG. 4 (see 1000 (3H)-950(10h). The ceramic material can have a particle size distribution $d_{10}$ (μm) of 1.5 to 2, $d_{50}$(μm) of 3.5 to 4, and/or $d_{90}$(μm) of 9 to 10. In a particular instance, the ceramic material can have been calcined at a first temperature of 975° C. to 1050° C. for 2 to 4 hours and at a second temperature of 875° C. to less than 975° C. for 8 to 12 hours. In one preferred instance, the ceramic material can be calcined at a first temperature of about 1000° C. for about 3 hours and at a second temperature of about 900 to 950° C., preferably about 950° C., for about 10 hours. The ceramic material can have a perovskite structure.

In another embodiment, there is disclosed a lead-free piezoelectric composite material comprising: (a) any one of the lead-free lithium doped potassium sodium niobate piezoelectric ceramic materials of the present invention; and (b) a polymeric matrix, wherein the ceramic material is dispersed in the polymeric matrix. In one instance, the composite material includes 5% to 50%, by volume, of the ceramic material. The polymeric matrix can be a thermoset polymeric matrix. Non-limiting examples of thermoset polymeric matrices include those comprising an epoxy resin, an unsaturated polyester resin, a polyurethane, bakelite, duroplast, urea-formaldehyde, diallyl-phthalate, an epoxy vinylester, a polyimide, a cyanate ester of polycyanurate, dicyclopentadiene, a phenolic, a benzoxazine, co-polymers thereof, or blends thereof. In a particularly preferred embodiment, the thermoset polymeric matrix is an epoxy resin. The epoxy resin can include diglycidyl ether bisphenol-A and polyoxypropylene diamine. In another instance, the polymeric matrix can be a thermoplastic polymeric matrix. Non-limiting examples of thermoplastic polymeric matrices include those that include polyethylene terephthalate (PET), a polycarbonate (PC) family of polymers, polybutylene terephthalate (PBT), poly(1,4-cyclohexylidene cyclohexane-1,4-dicarboxylate) (PCCD), glycol modified polycyclohexyl terephthalate (PCTG), poly(phenylene oxide) (PPO), polypropylene (PP), polyethylene (PE), polyvinyl chloride (PVC), polystyrene (PS), polymethyl methacrylate (PMMA), polyethyleneimine or polyetherimide (PEI) and their derivatives, thermoplastic elastomer (TPE), terephthalic acid (TPA) elastomers, poly(cyclohexanedimethylene terephthalate) (PCT), polyethylene naphthalate (PEN), polyamide (PA), polysulfone sulfonate (PSS), sulfonates of polysulfones, polyether ether ketone (PEEK), acrylonitrile butyldiene styrene (ABS), polyether ketone ketone (PEKK), polyphenylene sulfide (PPS), co-polymers thereof, or blends thereof. In preferred aspects, the thermoplastic polymeric matrix can include polypropylene, polyethylene, polyamide, a polycarbonate (PC) family of polymers, co-polymers thereof, or blends thereof. The lead-free piezoelectric composite material of the present invention can include (i) a piezoelectric charge constant ($d_{33}$ (pC/N)) of 10 to 14, preferably about 12; (ii) a dielectric constant ($\varepsilon 33_{(-)}$) of 13 to 17, preferable about 15; and/or (iii) a piezoelectric voltage constant ($g_{33}$(mV.m/N)) of 90 to 110, preferably about 95 to 100, or more preferably about 98. The composite material can be shaped into any type of form or mold. In one instance, for example, the material can be in the form of a film or sheet. The composite material can be structured as a 0-3 composite or as a 1-3 composite.

In still another aspect of the present invention there is disclosed a method of making any one of the lead-free lithium doped potassium sodium niobate piezoelectric ceramic materials of the present invention. The method can include: (a) obtaining a lead-free lithium doped potassium sodium niobate piezoelectric precursor material; and (b) subjecting the precursor material to a calcination procedure comprising: (i) a first calcination step that can include calcining the precursor material at a temperature of 975° C. to 1050° C. for 2 to 4 hours to obtain a first calcined material; and (ii) a second calcination step that can include calcining the first calcined material from step (i) at a temperature of 875° C. to less than 975° C. for 8 to 12 hours to obtain the lead-free lithium doped potassium sodium niobate piezoelectric ceramic material. The precursor material can include, consist essentially of, or consist of a mixture of $K_2CO_3$ powder, $Na_2CO_3$ powder, $Li_2CO_3$ powder, and $Nb_2O_5$ powder. The first calcination step can include calcining the precursor material at a temperature of about 1000° C. for about 3 hours to obtain the first calcined material and the second calcination step can include calcining the first calcined material from at a temperature of 900° C. to 950° C., preferably about 950° C., for about 10 hours. In one instance, the process can include cooling the first calcined material to room temperature prior to performing the second calcination step. The cooled first calcined material can be milled prior to, or during, the second calcination step. After the second calcination step, the material can be cooled to room temperature. The produced lead-free lithium doped potassium sodium niobate piezoelectric ceramic material can be subjected to a sonification step. The first calcination step can be used to form the single crystalline phase. The second calcination step can be used to form the cubicle particle morphology.

In the context of the present invention 32 embodiments are described. Embodiment 1 describes a lead-free lithium doped potassium sodium niobate piezoelectric ceramic material in powdered form and having a single crystalline phase. Embodiment 2 is the ceramic material of embodiment 1, having a following formula of $(K,Na)_{1-x}Li_xNbO_3$, wherein x is 0.05<x<0.07. Embodiment 3 is the ceramic material of embodiment 2, wherein the powdered single crystalline phase ceramic material has a substantially cubical particle morphology. Embodiment 4 is the ceramic material of embodiment 1, wherein the powdered single crystalline phase ceramic material has a substantially cubical particle morphology. Embodiment 5 is the ceramic material of any one of embodiments 1 to 4, having a particle size distribution $d_{10}$(μm) of 1.5 to 2, $d_{50}$(μm) of 3.5 to 4, and/or $d_{90}$(μm) of 9 to 10. Embodiment 6 is the ceramic material any one of embodiments 1 to 5, further characterized by a powder x-ray diffraction pattern as substantially depicted in FIG. 4 (see 1000 (3H)-950(10h)). Embodiment 7 is the ceramic material of any one of embodiments 1 to 6, wherein the material has been calcined at a first temperature of 975° C. to 1050° C. for 2 to 4 hours and at a second temperature of 875° C. to less than 975° C. for 8 to 12 hours. Embodiment 8 is the ceramic material of embodiment 7, wherein the material has been calcined at a first temperature of about 1000° C. for about 3 hours and at a second temperature of about 900 to 950° C., preferably about 950° C., for about 10 hours. Embodiment 9 is the ceramic material of any one of embodiments 1 to 8, wherein the ceramic material has a perovskite structure.

Embodiment 10 is a lead-free piezoelectric composite material that includes (a) any one of the lead-free lithium doped potassium sodium niobate piezoelectric ceramic materials of embodiments 1 to 8; and (b) a polymeric matrix, wherein the ceramic material is dispersed in the polymeric matrix. Embodiment 11 is the lead-free piezoelectric composite material of embodiment 10, that includes 5% to 50%, by volume, of the ceramic material. Embodiment 12 is the lead-free piezoelectric composite material of any one of embodiments 10 to 11, wherein the polymeric matrix is a thermoset polymeric matrix. Embodiment 13 is the lead-free piezoelectric composite material of embodiment 12, wherein the thermoset polymeric matrix comprises an epoxy resin, an unsaturated polyester resin, a polyurethane, bakelite, duroplast, urea-formaldehyde, diallyl-phthalate, an epoxy vinylester, a polyimide, a cyanate ester of polycyanurate, dicyclopentadiene, a phenolic, a benzoxazine, co-polymers thereof, or blends thereof. Embodiment 14 is the lead-free piezoelectric composite material of embodiment 13, wherein the thermoset polymeric matrix is an epoxy resin. Embodiment 15 is the lead-free piezoelectric composite material of embodiment 14, wherein the epoxy resin comprises diglycidyl ether bisphenol-A and polyoxypropylene diamine. Embodiment 16 is the lead-free piezoelectric composite material of any one of embodiments 10 to 11, wherein the polymeric matrix is a thermoplastic polymeric matrix. Embodiment 17 is the lead-free piezoelectric composite material of embodiment 16, wherein the thermoplastic polymeric matrix comprises polyethylene terephthalate (PET), a polycarbonate (PC) family of polymers, polybutylene terephthalate (PBT), poly(1,4-cyclohexylidene cyclohexane-1,4-dicarboxylate) (PCCD), glycol modified polycyclohexyl terephthalate (PCTG), poly(phenylene oxide) (PPO), polypropylene (PP), polyethylene (PE), polyvinyl chloride (PVC), polystyrene (PS), polymethyl methacrylate (PMMA), polyethyleneimine or polyetherimide (PEI) and their derivatives, thermoplastic elastomer (TPE), terephthalic acid (TPA) elastomers, poly(cyclohexanedimethylene terephthalate) (PCT), polyethylene naphthalate (PEN), polyamide (PA), polysulfone sulfonate (PSS), sulfonates of polysulfones, polyether ether ketone (PEEK), acrylonitrile butyldiene styrene (ABS), polyether ketone ketone (PEKK), polyphenylene sulfide (PPS), co-polymers thereof, or blends thereof. Embodiment 18 is the lead-free piezoelectric composite material of embodiment 17, wherein the thermoplastic polymeric matrix comprises polypropylene, polyethylene, polyamide, a polycarbonate (PC) family of polymers, co-polymers thereof, or blends thereof. Embodiment 19 is the lead-free piezoelectric composite material of embodiment 18, wherein the composite material has: (i) a piezoelectric charge constant ($d_{33}$ (pC/N)) of 10 to 14, preferably about 12; (ii) a dielectric constant ($\varepsilon 33_{(-)}$) of 13 to 17, preferable about 15; and/or (iii) a piezoelectric voltage constant ($g_{33}$(mV.m/N)) of 90 to 110, preferably about 95 to 100, or more preferably about 98. Embodiment 20 is the lead-free piezoelectric composite material of any one of embodiments 10 to 19, wherein the composite material is in the form of a film or sheet. Embodiment 21 is the lead-free piezoelectric composite materials of any one of embodiments 10 to 20, wherein the composite is a 0-3 composite. Embodiment 22 is the lead-free piezoelectric composite materials of any one of embodiments 10 to 21, wherein the composite is a 1-3 composite.

Embodiment 23 is a method of making any one of the lead-free lithium doped potassium sodium niobate piezoelectric ceramic materials of embodiments 1 to 9, the method including (a) obtaining a lead-free lithium doped potassium sodium niobate piezoelectric precursor material; and (b) subjecting the precursor material to a calcination procedure that includes (i) a first calcination step that includes calcining the precursor material at a temperature of 975° C. to 1050° C. for 2 to 4 hours to obtain a first calcined material; and (ii) a second calcination step that includes calcining the first calcined material from step (i) at a temperature of 875° C. to less than 975° C. for 8 to 12 hours to obtain the lead-free lithium doped potassium sodium niobate piezoelectric ceramic material. Embodiment 24 is the method of embodiment 23, wherein the precursor material comprises a mixture of $K_2CO_3$ powder, $Na_2CO_3$ powder, $Li_2CO_3$ powder, and $Nb_2O_5$ powder. Embodiment 25 is the method of embodiment 24, wherein the first calcination step includes calcining the precursor material at a temperature of about 1000° C. for about 3 hours to obtain the first calcined material. Embodiment 26 is the method of embodiment 25, wherein the second calcination step includes calcining the first calcined material from step (i) at a temperature of 900° C. to 950° C., preferably about 950° C., for about 10 hours. Embodiment 27 is the method of any one of embodiments 23 to 26, further comprising cooling the first calcined material from step (i) to room temperature prior to performing the second calcination step. Embodiment 28 is the method of embodiment 27, that further includes milling the cooled first calcined material. Embodiment 29 is the method of any one of embodiments 26 to 27, further comprising cooling the obtained lead-free lithium doped potassium sodium niobate piezoelectric ceramic material from step (ii) to room temperature. Embodiment 30 is the method of any one of embodiments 23 to 29, wherein the obtained lead-free lithium doped potassium sodium niobate piezoelectric ceramic material is subjected to a sonification step. Embodiment 31 is the method of any one of embodiments 23 to 30, wherein the first calcined material from step (i) has a single crystalline phase. Embodiment 32 is a piezoelectric that includes any one of the lead-free lithium doped potassium sodium niobate piezoelectric ceramic materials of embodiments 1 to 10 or the lead-free piezoelectric composite materials of embodiments 10 to 22.

33. The piezoelectric device of claim 32, wherein the device is a piezoelectric sensor, a piezoelectric transducer, or a piezoelectric actuator.

Also disclosed is a piezoelectric device comprising any one of the lead-free lithium doped potassium sodium niobate piezoelectric ceramic materials of the present invention or any one of the lead-free piezoelectric composite materials of the present invention, or both. Non-limiting examples of piezoelectric devices include piezoelectric sensors, piezoelectric transducers, and piezoelectric actuators.

The term "composite" refers to a material that includes two or more components mixed or dispersed together.

The term "piezoelectric" includes a material that is capable of generating a voltage when a mechanical stress or vibration is applied to the material.

The phrase "a polymerizable matrix" refers to a composition comprising monomers, polymers (two or more repeating structural units) or mixtures of monomers and polymers, or copolymers that can form a homogeneous or heterogeneous bulk composition when polymerized.

The terms "wt. %" or "vol. %" refers to a weight or volume percentage of a component based on the total weight or volume of material that includes the component. In a non-limiting example, 10 mL of a substance in 100 grams of the material is 10 vol. % of metal.

The term "about" or "approximately" are defined as being close to as understood by one of ordinary skill in the art, and in one non-limiting embodiment the terms are defined to be within 10%, preferably within 5%, more preferably within 1%, and most preferably within 0.5%.

The term "substantially" and its variations are defined as being largely but not necessarily wholly what is specified as understood by one of ordinary skill in the art, and in one non-limiting embodiment substantially refers to ranges within 10%, within 5%, within 1%, or within 0.5%.

The terms "inhibiting" or "reducing" or "preventing" or "avoiding" or any variation of these terms, when used in the claims and/or the specification includes any measurable decrease or complete inhibition to achieve a desired result.

The term "effective," as that term is used in the specification and/or claims, means adequate to accomplish a desired, expected, or intended result.

The use of the word "a" or "an" when used in conjunction with the term "comprising" in the claims or the specification may mean "one," but it is also consistent with the meaning of "one or more," "at least one," and "one or more than one."

The words "comprising" (and any form of comprising, such as "comprise" and "comprises"), "having" (and any form of having, such as "have" and "has"), "including" (and any form of including, such as "includes" and "include") or "containing" (and any form of containing, such as "contains" and "contain") are inclusive or open-ended and do not exclude additional, unrecited elements or method steps.

The ceramic materials of the present invention can "comprise," "consist essentially of," or "consist of" particular ingredients, components, compositions, etc. disclosed throughout the specification. With respect to the transitional phase "consisting essentially of," in one non-limiting aspect, a basic and novel characteristic of the ceramic materials of the present invention are their single crystalline phase structure and/or particle size and morphology.

Other objects, features and advantages of the present invention will become apparent from the following figures, detailed description, and examples. It should be understood, however, that the figures, detailed description, and examples, while indicating specific embodiments of the invention, are given by way of illustration only and are not meant to be limiting. Additionally, it is contemplated that changes and modifications within the spirit and scope of the invention will become apparent to those skilled in the art from this detailed description. In further embodiments, features from specific embodiments may be combined with features from other embodiments. For example, features from one embodiment may be combined with features from any of the other embodiments. In further embodiments, additional features may be added to the specific embodiments described herein.

BRIEF DESCRIPTION OF THE DRAWINGS

Advantages of the present invention may become apparent to those skilled in the art with the benefit of the following detailed description and upon reference to the accompanying drawings.

FIG. 6A-E are SEM micrographs of $(K,Na)_xLi_{1-x}NbO_3$ powders after calcination under various conditions.

DETAILED DESCRIPTION OF THE INVENTION

A two-stage calcination process was discovered in the context of the present invention that allows for the production of lead-free lithium doped potassium sodium niobate piezoelectric particles that have a single crystalline phase. These produced particles have piezoelectric properties comparable to PZT-based particles with the added benefit of being lead-free.

These and other non-limiting aspects of the present invention are provided in the following subsections.

A. Ceramic Piezoelectric Materials

The ceramic piezoelectric materials the present invention can have a formula of $(K,Na)_{1-x}Li_xNbO_3$ wherein the ratio of K to Na is about 1:1. In particularly, preferred instances, x can be 0.05<x<0.07. The ceramic material can be phase pure crystals with uniaxial cubical particle morphology. The ceramic material can have a particle size distribution of 0.1 microns<$d_{10}$<5 microns, 1 micron<$d_{50}$<10 microns, 5 microns<$d_{90}$<20 microns. In a particular embodiment, the ceramic material has a $d_{10}(\mu m)$ of 1.5 to 2, $d_{50}(\mu m)$ of 3.5 to 4, and $d_{90}(\mu m)$ of 9 to 10. Non-limiting values for the $d_{50}$ particle size value of the crystals are 1, 1.1, 1.2, 1.3, 1.4, 1.5, 1.6, 1.7, 1.8, 1.9, 2.0, 2.1, 2.2, 2.3, 2.4, 2.5, 2.6, 2.7, 2.8, 2.9, 3.0, 3.1, 3.2, 0.3.3, 3.4, 3.5, 3.6, 3.7, 3.8, 3.9, 4.0, 4.1, 4.2, 4.3, 4.4, 4.5, 4.6, 4.7, 4.8, 4.9, 5.0, 5.1, 5.2, 5.3, 5.4, 5.5, 5.6, 5.7, 5.8, 5.9, 6.0, 6.1, 6.2, 6.3, 6.4, 6.5, 6.6, 6.7, 6.8, 6.9, 7.0, 7.1., 7.2, 7.3, 7.4, 7.6, 7.8, 7.9, 8.0, 8.1., 8.2, 8.3, 8.4, 8.5, 8.6, 8.7, 8.8, 8.9, 9.0, 9.1, 9.2, 9.3, 9.4, 9.5, 9.6, 9.7, 9.8, 9.9, 10 microns or any range or value there between, with a range of 3.7 to 4.1 being preferred.

B. Preparation Crystalline Ceramic Piezoelectric Materials

Figure 1:
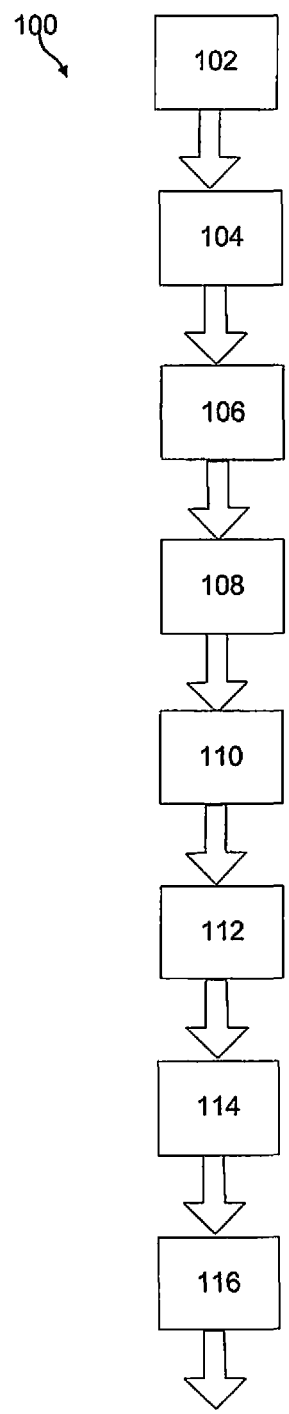
FIG. 1 is a flow chart of a method to make the ceramic piezoelectric ceramic materials.

One example of a method of making the ceramic piezoelectric materials of the present invention involves a solid state synthesis of the materials that incorporates a two stage calcination step. Referring to FIG. 1 (see also the Examples), a flow chart of a method 100 of producing a highly crystalline ceramic (KNN or doped KNN) materials having a pervoskite structure is described. In step 102, the ceramic precursors are obtained. The ceramic piezoelectric precursors can include potassium carbonate, sodium carbonate, niobium oxide, and lithium carbonate particles. The ceramic precursors are commercial available from many commercial chemical suppliers, for example, Sigma Aldrich®. In step 104, the ceramic precursors (e.g., Na, K, Li carbonates and $Nb_2O_3$) are mixed under conditions sufficient to refine the particles size of the powders and form an agglomerate-free homogeneous powder. Mixing can be done using any known mixing unit suitable to reduce the particle size of the powders and provide a homogeneous powder free of metal containments. Examples of mixing units include a ball mill, a high speed stirrer, an ultrasound mixer or combinations thereof. A preferred mixing unit is a ball mill with zirconia milling media (e.g., milling balls). The use of zirconia balls can limit unwanted metal contamination of the powders. In some aspects, a milling medium can be used to aid refinement of the particle size of the ceramic precursors. Non-limiting examples of milling medium include organic solvents (for example, cyclohexane, glycols, propanol, hexane or the like), water, or any combination thereof. The ceramic precursors can be milled for as long as needed to produce the desired particle size (e.g., 0.5, 1, 2, 3, 4, 5, 6, 7, 8, 9, 10, or more hours). In a preferred embodiment, the ceramic precursors are milled as slurry in cyclohexane for about 3 hours. If a slurry is used to mill the powders, the liquid medium can be removed under conditions sufficient to remove the liquid medium, but less than the calcination temperature (e.g., 100° C. to 160° C., or 100° C., 110° C., 120° C., 130° C., 140° C., 150° C. or 160° C. for 1 to 5 hours, with 150° C. at 3 hours being preferred).

One the precursor material is obtained, it can then be subjected to a two stage calcination step. During the calcination the following reaction to the perovskite should take place:

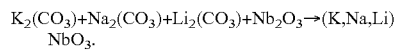

$K_2(CO_3)+Na_2(CO_3)+Li_2(CO_3)+Nb_2O_3 \rightarrow (K,Na,Li)NbO_3$.

In the first calcination step 106, the homogeneous, agglomerate-free ceramic precursor material is placed in a heating apparatus and heated in the presence of an oxidant (e.g., air or oxygen) at a specified rate (e.g., 1° C., 2° C., 3° C., 4° C., or 5° C. per minute) to a first calcination temperature. Once the first calcination temperature is achieved, the material is held at the first calcination temperature for a desired period of time (for example, 1, 2, 3, 4, 5, 6 7, 8, 9, 10 hours, with 3 hours being preferred). The first calcination temperature can be below the sintering temperature of the alkali metals (e.g., less than about 1100° C.), but high enough to promote formation of a crystalline ceramic structure with substantially a single crystalline phase. In one instance, no secondary phases are present. The first calcination average temperature can be greater than 950° C., 955° C., 960° C., 965° C., 970° C., 975° C., 980° C., 985° C., 990° C., 995° C., 1000° C., 1005° C., 1010° C., or any value there between or an average temperature ranging from greater than 950° C. to 1010° C., 960° C. to 1005° C., or 980° C. to 1000° C., with 1000° C. being preferred. In step 108, after heating at the first calcination temperature for a desired period of time (e.g., 1000° C. for 3 hours), the crystalline ceramic material is cooled to ambient temperature by circulating ambient air through the heating apparatus (e.g., free cooling). In step 110, the ceramic material is removed from the heating apparatus and milled in the mixing apparatus for a period of time sufficient to reduce the particle size to refine the particle size to submicron size (e.g., ads) of less than 1 micron, 0.9, 0.8, 0.7, 0.6, 0.5 microns or less). In step 112, the milled ceramic material is heated at a specified rate (e.g., 1° C., 2° C., 3° C., 4° C., or 5° C. per minute) per minute in the presence of an oxidant (e.g., air or oxygen) to a second calcination temperature for a desired period of time (for example, 1, 2, 3, 4, 5, 6 7, 8, 9, 10, 11, 12, 15 hours, with 10 hours being preferred). The second calcination temperature is lower than the first calcination temperature, but sufficiently elevated to allow the submicron size particles to crystallize together and form a ceramic material of phase pure crystals with uniaxial cubical particle morphology. In a preferred embodiment, LiKNN crystals (e.g. $((K,Na)_{1-x}Li_xNbO_3)$) are formed. The second calcination average temperature can be less than 1000° C., 995° C., 990° C., 985° C., 980° C., 975° C., 970° C., 965° C., 950° C., 955° C., 900° C., or any value there between or an average temperature ranging from greater than 900° C. to 1000° C., 920° C. to 975° C., or 930° C. to 950° C., with 900° C. to 950° C. being preferred. In step 114, after heating at the second calcination temperature for a desired period of time (e.g., 900 to 950° C. for 10 hours), the ceramic crystalline material is cooled to ambient temperature by circulating ambient air through the heating apparatus (e.g., free cooling). Without being bound by theory, it is believed that the two step calcination process with cooling to ambient temperature between the steps in the presence of oxidant (e.g., air) controls the formation of the crystal structure which results in the particles having a pure phase crystalline structure with a controlled shape (e.g., uniaxial cubical morphology). In step 116, the crystalline ceramic material can be removed from the heating apparatus and the crystals can be deagglomerated using known deagglomeration methods (e.g., ultrasonicating the crystals) for a sufficient amount of time (e.g. 0.25, 0.5, 1, 1.25, 1.5, 2 hours). In some aspects, the crystals can be mixed with a liquid medium to assist in the deagglomeration process. In some instances, deagglomeration is not necessary. Any ultrasonicating or milling medium known in the art or described herein can be used, with cyclohexane being preferred. The crystalline ceramic material can be removed from the deagglomeration unit. If a deagglomeration medium is used, the particles can be filtered and/or dried under conditions sufficient to remove the medium (e.g., 100° C. to 160° C. for 1 to 5 hours, with 150° C. at 3 hours being preferred). The resulting ceramic materials (e.g., KNN or LiKNN) can be used to make one or more piezoelectric materials and/or stored under dry conditions.

C. Piezoelectric Composite

Figure 2A:
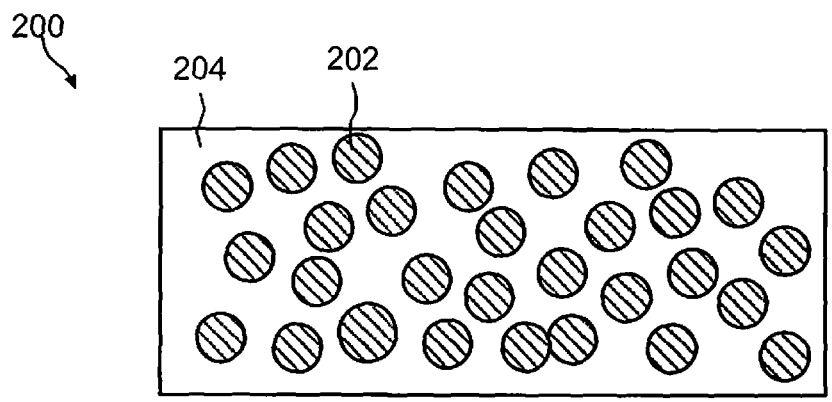
FIG. 2A is a schematic of a 0-3 piezoelectric ceramic composite.
Figure 2B:
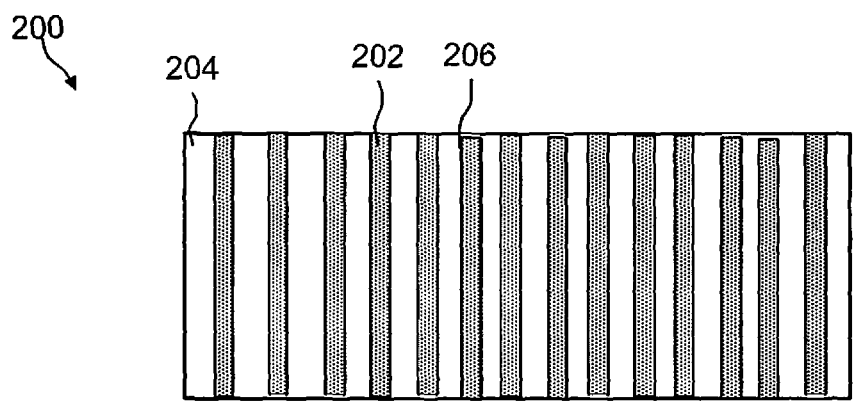
FIG. 2B is a schematic of a 1-3 piezoelectric ceramic composite.

The ceramic piezoelectric materials of the invention can be used to make a variety of piezoelectric composites. The piezoelectric composites can have various types of connectivity with the geometry of the composite being based on the connectivity. For example, for two-phase composite systems there are ten types of connectivity and for three to four phase systems there can be 20 to 35 types of connectivity. Geometry and connectivity designs can be done using known piezoelectric composite methods. FIGS. 2A and 2B show two types of connectivity for a two phase composite system. FIG. 2A is a schematic of a 0-3 type connectivity. FIG. 2B is a schematic of a 1-3 type connectivity. Referring to FIG. 2A, the composite 200 with 0-3 has piezoelectric particles 202 randomly dispersed within the polymer matrix 204. The matrix 204 can be connected to itself in all three spatial directions, while the particles 202 lack contact. As such, effective medium (EM) theory portrays the hulk, or apparent properties of these composites as isotropic.

1. Composite Materials

The composite can include the piezoelectric ceramic materials of the present invention described throughout the specification and a polymer matrix. The polymer matrix can include thermoset or thermoplastic polymers. Some non-limiting examples include epoxy resin, an unsaturated polyester resin, a polyurethane, bakelite, duroplast, urea-formaldehyde, diallyl-phthalate, an epoxy vinylester, a polyimide, a cyanate ester of polycyanurate, dicyclopentadiene, a phenolic, a benzoxazine, co-polymers thereof, or blends thereof. These polymer are commercially available many commercial suppliers. In a preferred embodiment, an epoxy resin is used. In a particular embodiment, a two component epoxy system is used, with diglycidyl ether bisphenol-A and polyoxypropylene diamine being a preferred. Such a two component system and other epoxy resins are commercially available from Epoxy Technology, Inc. Billerica, Mass. USA) and/or SABIC Innovative Plastics (USA). The composite material can include thermoplastic polymers which can become pliable or moldable above a specific temperature, and return back to a more solid state upon cooling. There are a wide range of various thermoplastic polymers, and blends thereof that can be used to make a composite layer or material of the present invention. Some non-limiting examples include polyethylene terephthalate (PET), a polycarbonate (PC) family of polymers, polybutylene terephthalate (PBT), poly(1,4-cyclohexylidene cyclohexane-1,4-dicarboxylate) (PCCD), glycol modified polycyclohexyl terephthalate (PCTG), poly(phenylene oxide) (PPO), polypropylene (PP), polyethylene (PE), polyvinyl chloride (PVC), polystyrene (PS), polymethyl methacrylate (PMMA), polyethyleneimine or polyetherimide (PEI) and their derivatives, thermoplastic elastomer (TPE), terephthalic acid (TPA) elastomers, poly (cyclohexanedimethylene terephthalate) (PCT), polyethylene naphthalate (PEN), polyamide (PA), polysulfone sulfonate (PSS), sulfonates of polysulfones, polyether ether ketone (PEEK), acrylonitrile butyldiene styrene (ABS), polyether ketone ketone (PEKK), polyphenylene sulfide (PPS), co-polymers thereof, or blends thereof. In a particular embodiment, polypropylene, polyethylene, polyamide, a polycarbonate (PC) family of polymers, co-polymers thereof, or blends thereof. Thermoplastic polymers are available from SABIC Innovative Plastics (USA).

2. Preparation of Composite

The composite can be made using known methods to make piezoelectric composites. The amounts of polymer matrix and piezoelectric materials can be determined such that from 5% to 90%, 10% to 80%, or 20% to 50% by volume of the ceramic composite is piezoelectric materials. A non-limiting example includes mixing the ceramic piezoelectric materials of the present invention with a polymer matrix described above and throughout the specification at a high rate of speed (e.g., 2500 rpm, 3000 rpm, 3500 rpm, etc.) for a desired amount of time. The dispersion can be cured (e.g., hardened) during shaping by using agents and/or conditions appropriate for thermosets or thermoplastic polymer systems. Non-limiting examples of curing include cooling, UV curing, heat accelerated curing or compression curing of the dispersion. For example, an epoxy resin and ceramic particles were mixed together for a desired amount of time, hardener added, and the mixed again, followed by degassing in vacuum for 10 minutes to form an unstructured composite having a 0-3 connectivity. The piezoelectric composite can be shaped using injection molding, extrusion, compression molding, blow molding, thermoforming or other known methods.

If a structured composite is desired, known structuring techniques and those described throughout this specification can be used. Referring back to FIG. 2B, the piezoelectric composite 200 can have orthotopic or transversely isotropic (e.g., 1-3 connectivity) as the piezoelectric ceramic materials have structural organization. Structural organization can be done using methods known in the art. On example includes wafering the ceramic materials 202 into rod-like structures 206, and backfilling the voids with intended material. Others entail weaving fibers of the ceramic material through a semi-porous matrix or manually aligning long fibers of the ceramic material 202 and then filling the surrounding area with the composite matrix 204. These techniques result in the ceramic material 202 forming continuous columns 206 that span the thickness of the composite. While there can be large increases in composite properties by utilizing 1-3 composites, they can be quite costly, labor intensive, and time consuming to produce. Non-uniform electric fields can be used to structure the ceramic particles 202 using dielectrophoresis to force the ceramic particles into columns 206. The dielectrophoresis is based upon the surface charges induced on dielectric particles in an electric field, and the interactions between the polarized particles and the applied electric fields. Structured 1-3 composites can be created by utilizing the dielectrophoretic force while the matrix material 204 is still fluid. While the inclusions are still mobile, the dielectrophoretic force structures them into column-like structures 206 (chains), where they are held until the composite matrix has solidified. Once completed, this technique successfully creates 1-3 structured composites using manufacturing techniques similar to those for 0-3 materials. Using dielectrophoresis with the ceramic piezoelectric materials of the present invention results in the creation of composites with 1-3 connectivity that are lead-free and exhibit an increase in dielectric, piezoelectric, and mechanics, properties compared to 0-3 composites. Other methods include the use of piezoelectrophoresis. In piezoelectrophoresis, an externally applied electric field is applied at the same frequency with a cyclic hydrostatic pressure can result in the creation of "chains" and 1-3 structured composites. This field care be applied in phase or out of phase, depending on the materials utilized. Also, as the piezoelectrophoresis torque causes the particles to align their net moment with the electric field, this can also result in the formation of net piezoelectric 1-3 structured composites without the need for an externally applied electric field during a standard poling procedure. If a cyclic hydrostatic pressure is applied without the addition of an external electric field, composites with 3-3 connectivity can also be created, exhibiting an increase in dielectric, piezoelectric, and mechanics, properties compared to 0-3 composites.

In a non-limiting example, the unstructured composite can be subject to dielectrophoresis during the early stage of curing. A non-limiting example includes applying an alternating voltage across a dispersion of ceramic particles shortly after the hardener has been added to the epoxy resin.

3. Piezoelectric Ceramic Composites

The piezoelectric ceramic composites made using the piezoelectric ceramic materials of the present invention and polymer matrixes described throughout the specification are lead free. Such a composite includes 5% to 50% by volume of the piezoelectric ceramic material. A charge constant for the piezoelectric ceramic ($d_{33}$ (pC/N)) can range from 10 to 14, or 10, 11, 12, 13, 14, with 12 being preferable. The composite can have a dielectric constant ($ε33_{(-)}$) of 13 to 17, or 13, 14, 15, 16, 17, with 15 being preferred. The piezoelectric voltage constant ($g_{33}$(mV.m/N)) of the composite can range from 90 to 110, or 95 to 100, or 90, 91, 92, 93, 94, 95, 96, 97, 98, 99, 100, 101, 102, 103, 104, 105, 106, 107, 108, 109, 110, with 98 being preferred. The piezoelectric composites of the present invention are highly improved as compared to composites which were processed in a conventional way and have comparable properties to lead containing composites (See, for example, values in Table 3).

The piezoelectric composite materials can be used in all types of applications and devices that utilize piezoelectric properties. Non-limiting examples include piezoelectric devices such as piezoelectric sensors, piezoelectric transducers, or piezoelectric actuators. These devices can be utilized in medical diagnostics, industrial automation, defense, and communication systems and the like.

EXAMPLES

The present invention will be described in greater detail by way of specific examples. The following examples are offered for illustrative purposes only, and are not intended to limit the invention in any manner. Those of skill in the art will readily recognize a variety of noncritical parameters which can be changed or modified to yield essentially the same results. All starting materials were obtained from Sigma-Aldrich® (USA).

Example 1

Preparation of KNN Piezoelectric Precursors $(K,Na)_xLi_{1-x}NbO_3$.

Stoichiometric proportions of $K_2CO_3$, $Na_2CO_3$, $Li_2CO_3$, and $Nb_2O_5$ (>99.9% purity) powders were mixed in a cyclohexane medium using polypropylene lined mixer using zirconia balls for 3 hours. The resulting slurry was dried in a hot air oven for 24 hours. The dried metal salt composition was divided into 6 samples (Samples 1-5 in Table 1) and calcined at different temperatures.

Example 2

Calcination Procedure of LiKNN Piezoelectric Precursors

First Calcination.

The calcination of the dried metal salt composition was performed in a closed alumina crucible at a first calcination temperature by heating the samples at a rate of 5° C./min until the first calcination temperature was reached, held at the first calcination temperature for 3 hours then cooled to ambient temperature. After the first calcination, the (K,Na)$_x$Li$_{1-x}$NbO$_3$ powder was ball milled for 3 hours to refine the particle size. The calcination temperatures are listed in Table 1.

Second Calcination.

Figure 3:
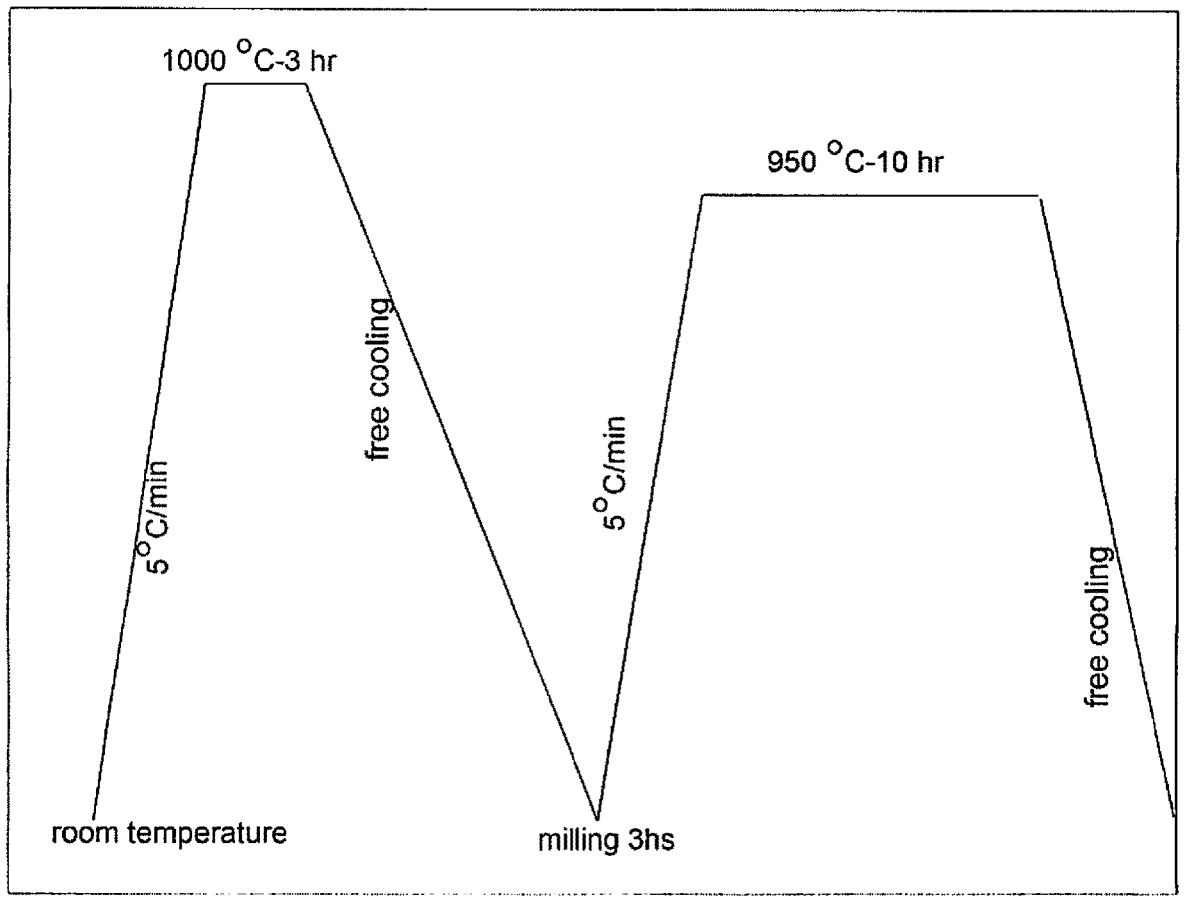
FIG. 3 is a graph of the two-stage calcination process of the present invention.

After ball milling, samples 4 and 5 were heated to a second calcination temperature at a rate of 5° C./min until the second calcination temperature was reached, held at the calcination temperature for 10 hours, and then cooled to ambient temperature. The calcination temperatures are listed in Table 1. After calcination the powders were ultrasonicated for 1 hour in a cyclohexane medium, dried at 150° C. for 3 hours and stored in an air ventilated drying oven to avoid moisture absorption. FIG. 3 is a graphical depiction of the two-stage calcination process of the present invention.

TABLE 1

| Sample No. | First Calcination Temperature, ° C. | First Calcination Time, h | Second Calcination Temperature, ° C. | Second Calcination Time, h |
|---|---|---|---|---|
| 1 | 900 | 3 | — | — |
| 2 | 1000 | 3 | — | — |
| 3 | 1100 | 3 | — | — |
| 4 | 1000 | 6 | — | — |
| 5 | 1000 | 3 | 900 | 10 |
| 6 | 1000 | 3 | 950 | 10 |

Example 3

Analysis of (K,Na)$_x$Li$_{1-x}$NbO$_3$ Piezoelectric Ceramic Materials

Figure 4:
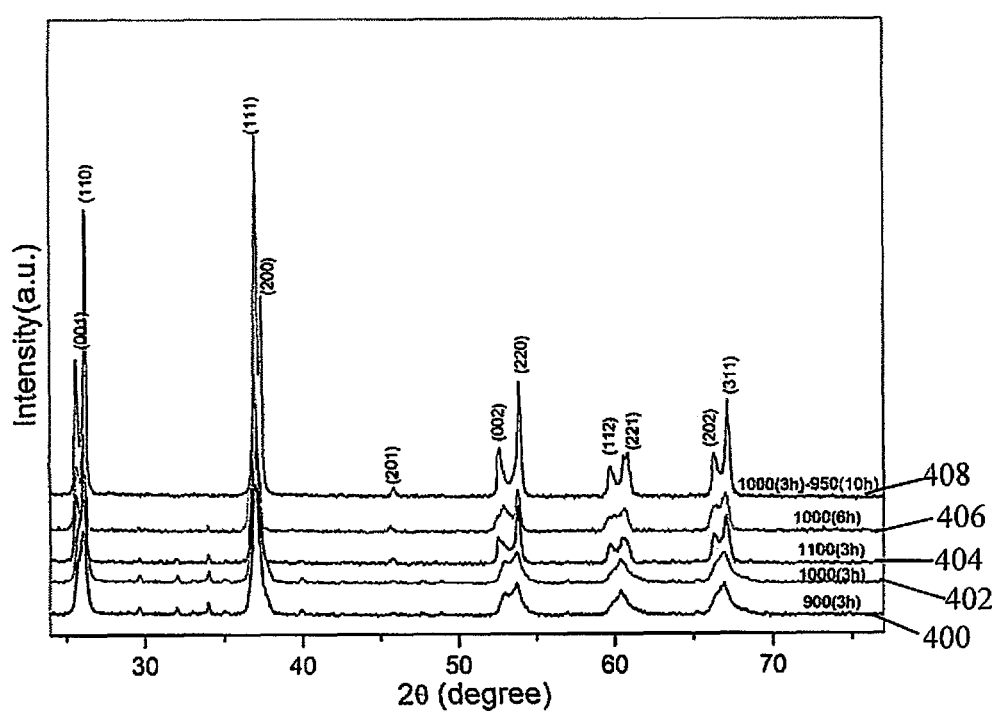
FIG. 4 are XRD patterns of $(K,Na)_xLi_{1-x}NbO_3$ powders after calcination under various conditions.
Figure 5:
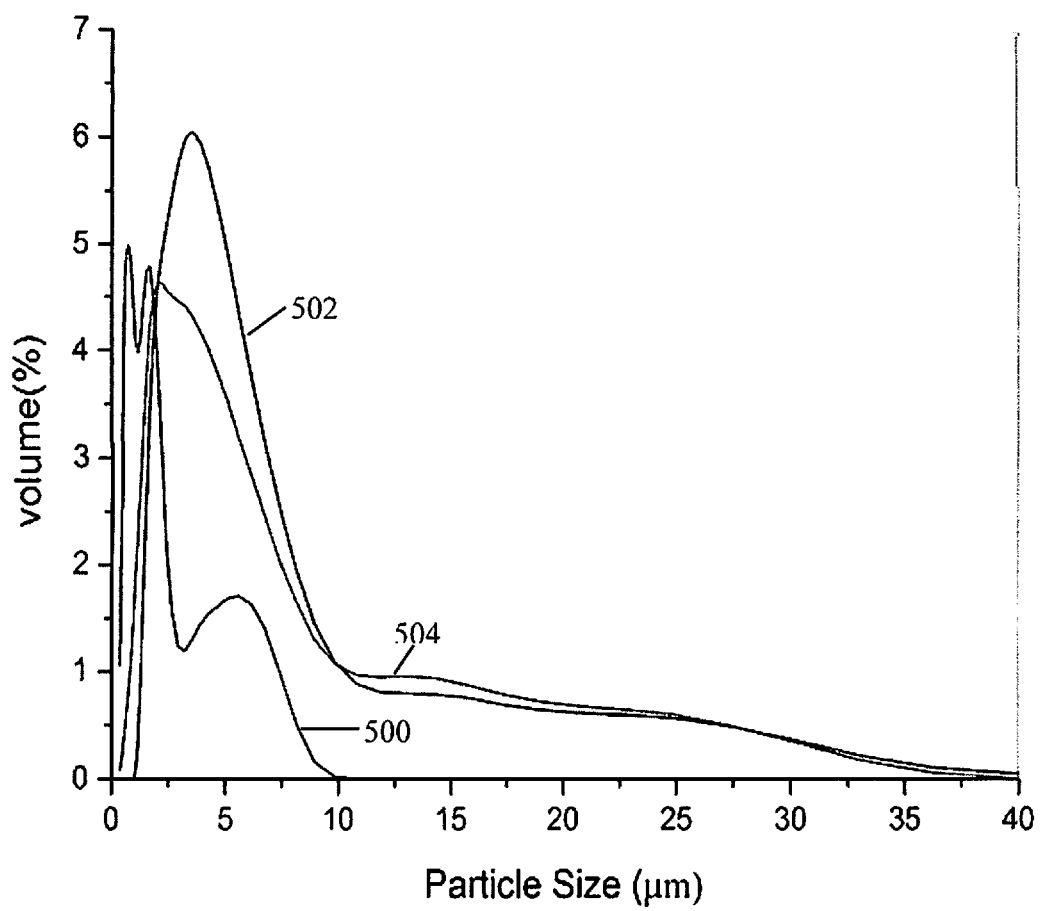
FIG. 5 are graphs of particle size in micrometers versus volume percent for $(K,Na)_xLi_{1-x}NbO_3$ powders after calcination under various conditions.
Figure 6E:
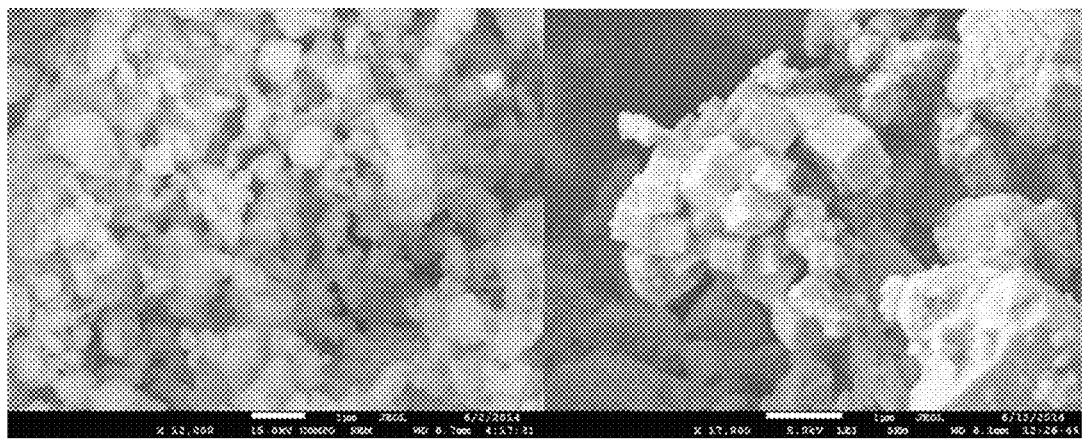
Figure 6E:
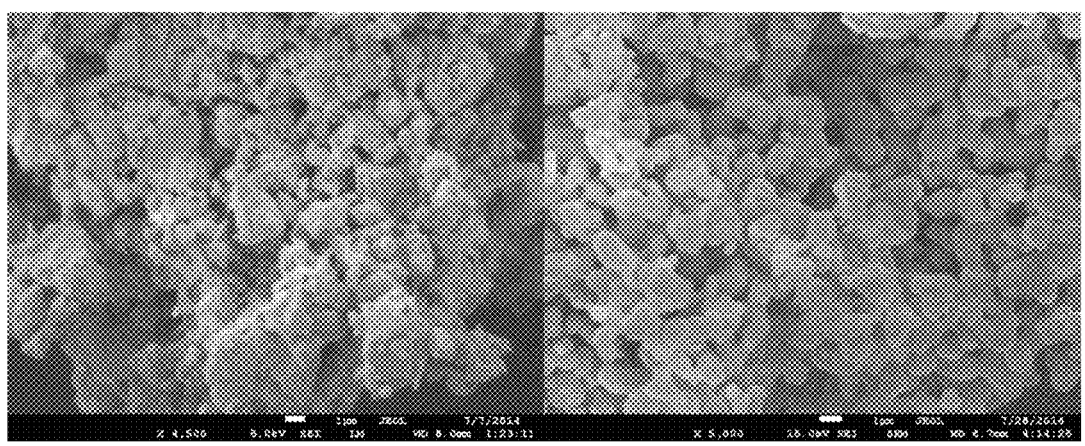
Figure 6E:
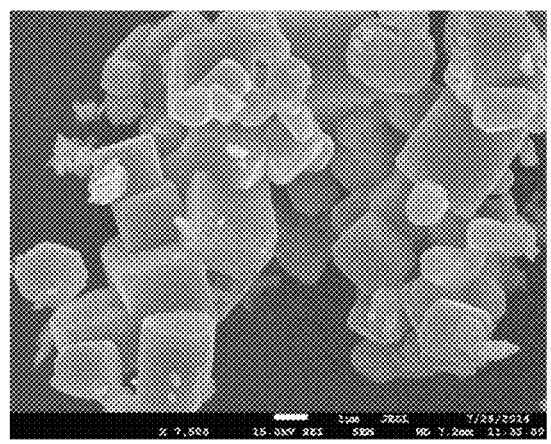

The crystal structure and phase purity of the calcined powders were analyzed by X-Ray Diffraction (XRD) techniques (Brucker D8 diffractometer (GERMANY) having CoKα1 x-rays). FIG. 4 are XRD patterns of Samples 1-4 and 6. Data line 400 is Sample 1, data line 402 is Sample 2, data line 404 is Sample 3, data line 406 is sample 4 and data line 408 is Sample 6. From the XRD patterns, the samples have similar diffraction patterns except that Samples 3, 4 and 6 exhibited a defined secondary phase (peaks, 112 and 202) with sample 6 having the sharpest peaks. The XRD analysis confirmed the development of pervoskite phase (secondary phase) for powders calcined at 1000° C. for 6 hours (Sample 4), 1100° C. for 3 hours (Sample 3), and the double calcined sample (Sample 6). The particle size distribution and morphology of the (K,Na)$_x$Li$_{1-x}$NbO$_3$ powders were analyzed using a particle size analyzer and scanning electron microscopy (SEM, JEOL, JSM-7500F). FIG. 5 are graphs of particle size in micrometers versus volume percent for Samples 1 (data line 500), 2 (data line 502) and 6 (data line 504). Table 2 lists the particle size distribution for Samples 1-3, 5 and 6. From the particle size distribution data, it was determined that the particle size distribution for samples 1, 3, 5 and 6 remained relatively the same. Comparing Samples 1, 2, 5 and 6 with Sample 3, the particle size increased (i.e., the particles became agglomerated) when the calcination temperature was 1100° C. This was confirmed using SEM. FIG. 6A-E are SEM micrographs of Samples 1-3, 5 and 6. FIG. 6A is a SEM micrograph of Sample 1, FIG. 6B is a SEM micrograph of Sample 2, FIG. 6C is a SEM micrograph of Sample 3, FIG. 6D is a SEM micrograph of sample 5, and FIG. 6E is an SEM micrograph of Sample 6. From the XRD patterns, particle size distribution data, and the SEM micrographs it was concluded that the first high temperature calcination step formed the crystal structure without secondary phases. During the second calcination step at lower temperatures for a longer time, the submicron size particles crystallize together to form a second crystal structure have micron size cubical particles as shown in FIGS. 6D and 6E.

TABLE 2

| Sample No. | Particle Size At $d_{10}$(μm) | Particle Size At $d_{50}$(μm) | Particle Size At $d_{90}$(μm) |
|---|---|---|---|
| 1 | 0.554 | 1.3 | 4.6 |
| 2 | 1.230 | 3.1 | 10.1 |
| 3 | 4.848 | 50.9 | 119.8 |
| 5 | 2.2 | 4.1 | 7.9 |
| 6 | 1.9 | 3.8 | 9.7 |

Example 4

Preparation of Composite with (K,Na)$_x$Li$_{1-x}$NbO$_3$. Piezoelectric Ceramic Materials Polymer Composite.

A two component epoxy system (Epotek, 302-3M, Epoxy Technology, Inc. Billerica, Mass., USA) based on diglycidyl ether bisphenol-A (DGEBA) resin and poly(oxypropyl)-diamine (POPD) multifunctional aliphatic amine curing agent was used. As per the manufactures' data sheet, the system exhibited a viscosity of 0.8-1.6 PaS after mixing and at room temperature (25° C.). Without wishing to be bound by theory, it is believed that the relatively high viscosity of the matrix prevents quick settling of dense ceramic particles during electrophoresis. The epoxy resin and piezoelectric ceramic particles were mixed together using a high speed mixer (Speed Mixer DAC 150 FVZ) at 3000 rpm for 3 minutes after which the hardener was added and the composite resin was mixed again at 3000 rpm at 5 minutes followed by degassing in vacuum for 10 minutes to form unstructured 0-3 composites 1, 2, 3, 5, and 6 from piezoelectric ceramic samples 1, 2, 3, 5 and 6. The unstructured composite 0-3 samples was prepared were molded into circular disc shaped samples.

Composite Structuring.

A portion of the unstructured composite samples 5 and 6 (LiKNN-polymer composite) were structured using dielectrophoresis (DEP). An alternating (1 kV/mm) voltage was applied across the suspension of ceramic particles in the epoxy matrix during the early stage of curing in a mold. The voltage was kept over the sample unit the epoxy resin was cured.

Figure 7A:
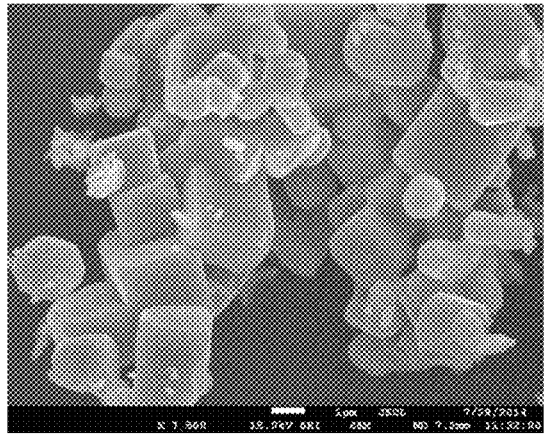
FIG. 7A is a SEM tomography image DEP aligned KNN-epoxy composite of the present invention.
Figure 7B:
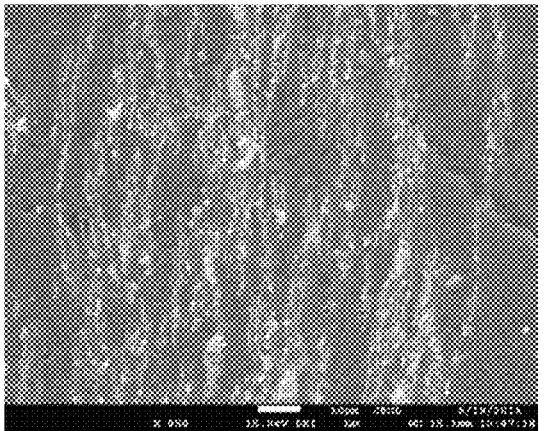
FIG. 7B is an SEM image DEP aligned KNN-epoxy composite of the present invention.
Figure 7C:
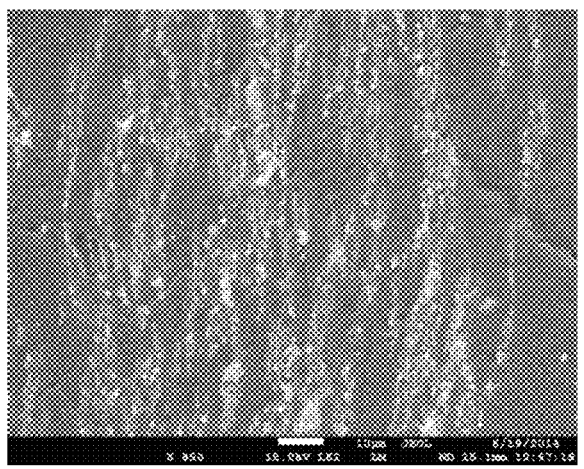
FIG. 7C is a magnified image of the DEP aligned KNN-epoxy composite of FIG. 7B.
Figure 7D:
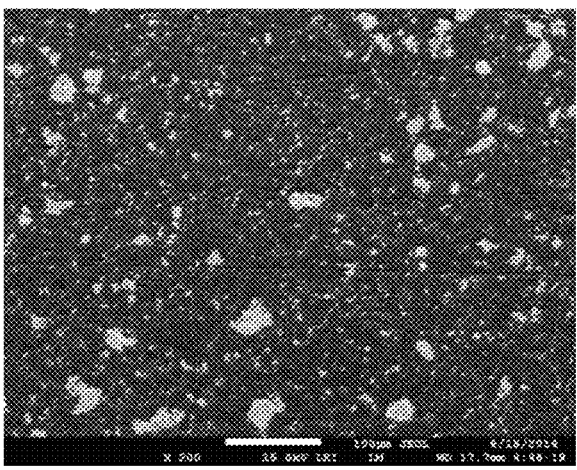
FIG. 7D is a SEM image of an unaligned (random) 0-3 composite.

The cured samples were de-molded to provide circular disc shaped samples having a dimension of 16 mm×0.5 mm. The discs were fine polished on both sides and post cured at 100° C. for 1 hour. The cross-section of the structured composite of the invention and the unstructured 0-3 composite were analyzed using a scanning electron microscopy. FIG. 7A is a SEM tomography image DEP aligned LiKNN-epoxy composite. FIG. 7B is an SEM image DEP aligned LiKNN-epoxy composite. FIG. 7C is a magnified image of the DEP aligned KNN-epoxy composite of FIG. 7B FIG. 7D is a SEM image of an unaligned (random) 0-3 composite.

Example 5

Electrical Properties of LiKNN-Composites

Procedure.

Samples 1-3 and 5-6 were electroded on both sides by gold sputtering. The samples were poled at 80° C. in a circulating oil bath. The effect of the magnitude of the poling filed and its duration on the piezoelectric coefficients was analyzed. The dielectric constant of the composites was measured using parallel plate capacitor method using an Agilent 4263B LCR meter at 1 V and 1 kHz. The thickness mode piezoelectric charge constant, $d_{33}$, was measured using a Berlincourt type $d_{33}$ meter (PM300, PiezoTest), set to 110 Hz. The thickness mode piezoelectric voltage constant $g_{33}$, was calculated via the relation:

$$g_{33} = d_{33}/\epsilon_\gamma \epsilon_\theta$$

Table 3 lists the piezoelectric properties of the structured composites of the invention (sample 5 and 6) and unstructured 0-3 composites (Sample 1-3).

TABLE 3

| Sample No. | % LiKNN | $d_{33}$ · (pC/N) | $g_{33}$ (mV · m/N) |
|---|---|---|---|
| 1 | | 3 | 36 |
| 2 | | 4.8 | 42 |
| 3 | | 5.5 | 45 |
| 5 | | 6 | 58 |
| 6 | 0.1 | 12 | 98 |

Figure 8:
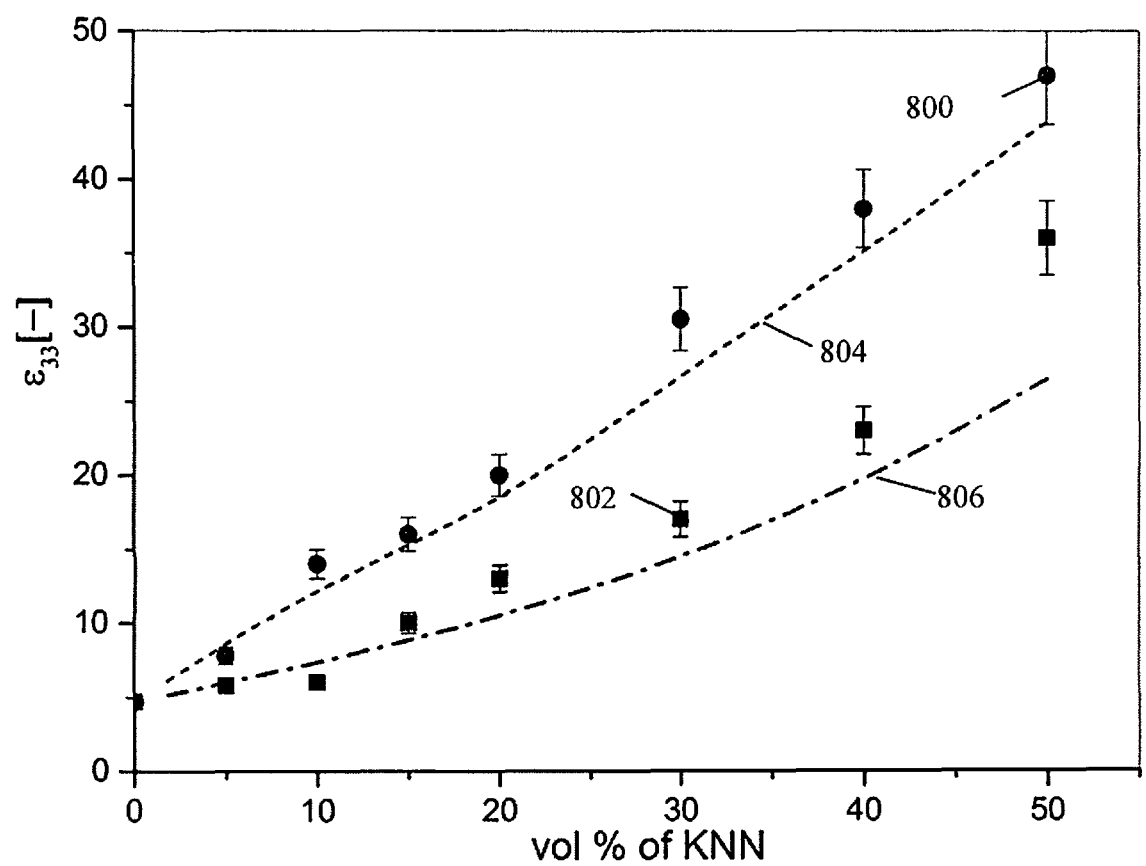
FIG. 8 are graphs of the variations of piezoelectric charge coefficient of the structured KNN composite of the invention, an unstructured 0-3 composite made from samples, theoretical model Van den Ende and theoretical model Yamada, n=5 versus dielectric constant of the composite ($\epsilon33_{(-)}$).
Figure 9:
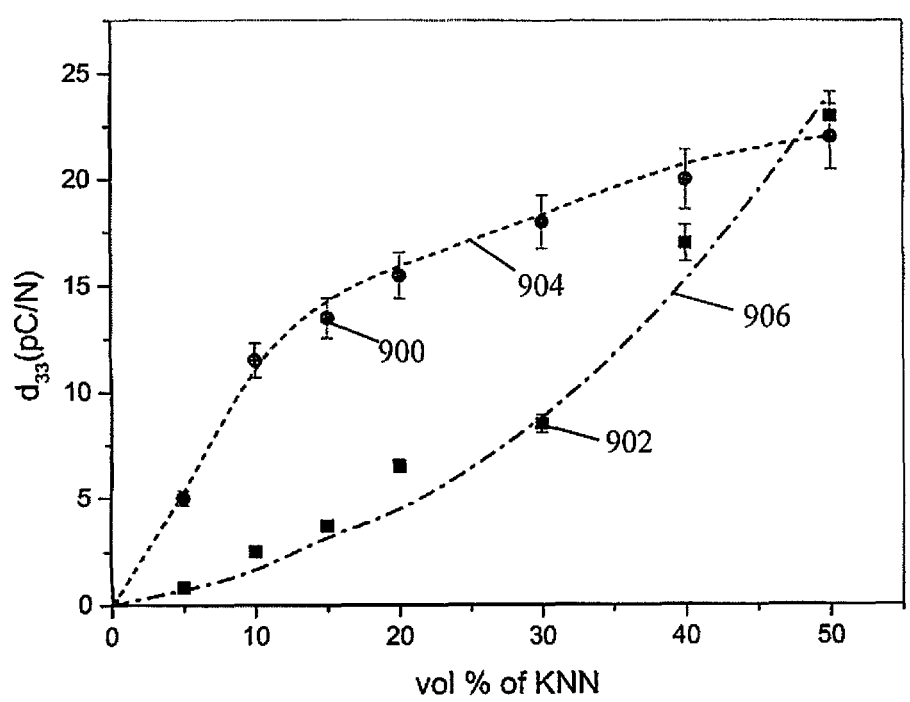
FIG. 9 are graphs of concentration of the structured KNN composite of the invention and an unstructured 0-3 composite, in vol % and theoretical models versus the piezoelectric charge coefficient of the composites $d_{33}\cdot(pC/N)$.
Figure 10:
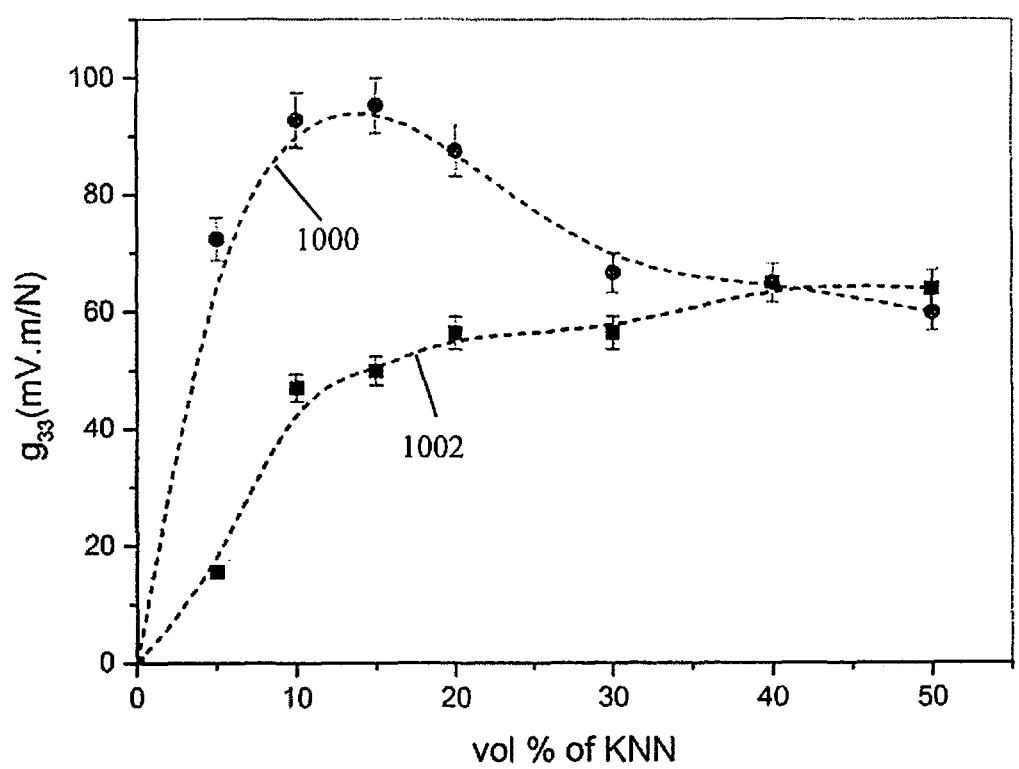
FIG. 10 are graphs of concentration the structured KNN composite of the invention and an unstructured 0-3 composite in vol % versus piezoelectric voltage coefficient of the composites ($g_{33}(mV.m/N)$).

FIG. 8 are graphs of the variations of piezoelectric charge coefficient of the structured LiKNN composite of the invention (data points 800 with error bars), an unstructured 0-3 composite (data points 802, with error bars) of the present invention, and theoretical models Bowen (data points 804) and Yamada, n=5 (data points 806) versus dielectric constant of the composite ($\epsilon 33_{(-)}$). FIG. 9 are graphs of structured composites of the present invention (data point 900, with error bars) and 0-3 composites in vol. % (data points 902, with error bars) and theoretical models Van den Ende (data points 904) and Yamada, n=5 (data point 906) versus the piezoelectric charge coefficient of the composite $d_{33}$·(pC/N). FIG. 10 are graphs of structured composites of the present invention (data line 1000) and 0-3 composites in vol. % (data line 1002) versus piezoelectric voltage coefficient of the composite ($g_{33}$(mV.m/N)).

Comparative Study.

Figure 11:
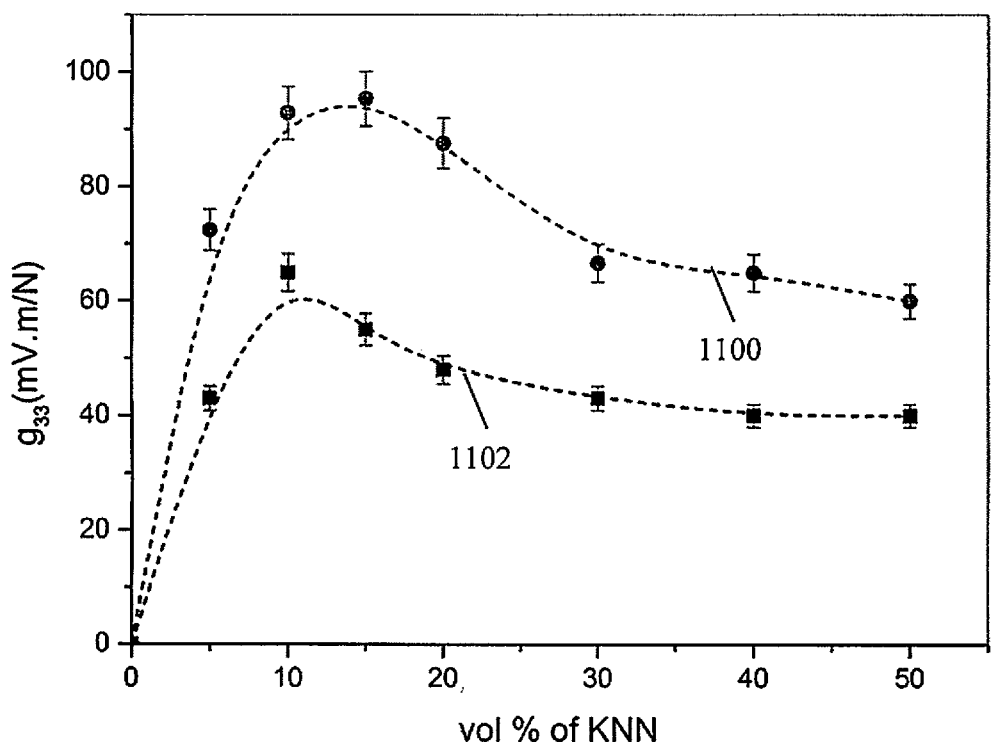
FIG. 11 are graphs of concentration of the structured KNN composite of the invention and PZT-507 versus piezoelectric voltage coefficient $g_{33}(mV.m/N)$.

FIG. 11 are graphs of concentration of the structured LiKNN composite of the invention (data line 1100) and a PZT-507 (PbZrTi) composite data line (1102) versus piezoelectric voltage coefficient $g_{33}$(mV.m/N). From the data, it can be concluded that a two-step calcination method to fabricate well-defined morphological structures for lead-free ceramics has been demonstrated. The composites made by this method have highly improved piezoelectric properties as compared to composites which are processed using conventional methods. Table 4 lists the electrical properties of the composite sample 6 and publically available Thus, lead free piezoelectric composites can be made that have properties comparable to lead containing composites.

TABLE 4

| Composite | $d_{33}$ · (pC/N) | $\epsilon 33_{(-)}$ | $g_{33}$ (mV · m/N) |
|---|---|---|---|
| Structured Epoxy/0.1 LiKNN (Sample 6) | 12 | 15 | 98 |
| Structured epoxy/0.2PT | 8.5 | 11.2 | 85 |

TABLE 4-continued

| Composite | $d_{33}$ · (pC/N) | $\epsilon 33_{(-)}$ | $g_{33}$ (mV · m/N) |
|---|---|---|---|
| Structured epoxy/0.1 PZT (507) | 6 | 8 | 65 |
| Structured epoxy/0.1PZT (5A4) | 7.5 | 10 | 77 |
| LCT/PA/0.5PZT | 73 | 42 | 65 |
| PA/0.5 PZT | 28 | 68 | 48 |
| LCT/0.4 PZT | 13 | 30 | 48 |
| Epoxy/0.685 PZT | 50 | 120 | 47 |
| PVDF/0.7PZT | 26 | 100 | 30 |
| PVDF/0.67PZT | 48 | 152 | 36 |
| PVDF/0.5 PZT (hot press) | 14 | 95 | 16 |
| PVDF/0.5 PZT (solution cast) | 9 | 30 | 36 |
| Ionomer/0.3 PZT | 5.2 | 9 | 52 |

The invention claimed is:

1. A lead-free piezoelectric composite material comprising:
   (a) a lead-free lithium doped potassium sodium niobate piezoelectric ceramic material of formula $(K,Na)_{1-x}Li_xNbO_3$, wherein $0.05<x<0.07$ and wherein the ratio of K to Na is about 1:1, wherein the lead-free lithium doped potassium sodium niobate piezoelectric ceramic material is in powdered form and that has a single crystalline phase and a substantially cubicle particle morphology; and
   (b) a polymeric matrix,
   wherein the ceramic material is dispersed in the polymeric matrix.

2. A lead-free piezoelectric composite material comprising:
   (a) a lead-free lithium doped potassium sodium niobate piezoelectric ceramic material of formula $(K,Na)_{1-x}Li_xNbO_3$, wherein $0.05<x<0.07$ and wherein the ratio of K to Na is about 1:1, wherein the lead-free lithium doped potassium sodium niobate piezoelectric ceramic material is in powdered form and that has a single crystalline phase and a substantially cubicle particle morphology; and
   (b) a polymeric matrix,
   wherein the ceramic material is dispersed in the polymeric, comprising 5% to 50%, by volume, of the ceramic material.

3. The lead-free piezoelectric composite material of claim 1, wherein the polymeric matrix is a thermoset polymeric matrix.

4. The lead-free piezoelectric composite material of claim 1, wherein the polymeric matrix is a thermoplastic polymeric matrix.

5. The lead-free piezoelectric composite material of claim 1,
   wherein the composite material at 5 to 50% by volume of the ceramic material has:
   (i) a piezoelectric charge constant ($d_{33}$ (pC/N)) of 10 to 14;
   (ii) a dielectric constant ($\epsilon 33_{(-)}$) of 13 to 17; and/or
   (iii) a piezoelectric voltage constant ($g_{33}$(mV.m/N)) of 90 to 110.

6. The lead-free piezoelectric composite materials of claim 1, wherein the composite is a 0-3 composite or a 1-3 composite.

7. A method of making a lead-free lithium doped potassium sodium niobate piezoelectric ceramic material of formula $(K,Na)_{1-x}Li_xNbO_3$, wherein the ratio of K to Na is about 1:1, wherein $0.05<x<0.07$ in powdered form, the method comprising:
   (a) obtaining a lead-free lithium doped potassium sodium niobate piezoelectric precursor material; and (b) subjecting the precursor material to a calcination procedure comprising:
  (i) a first calcination step that includes calcining the precursor material at a temperature of 975° C. to 1050° C. for 2 to 4 hours to obtain a first calcined material having a single crystalline phase; and
  (ii) a second calcination step that includes calcining the first calcined material from step (i) at a temperature of 875° C. to less than 975° C. for 8 to 12 hours to obtain the lead-free lithium doped potassium sodium niobate piezoelectric ceramic material in powder form having a substantially cubicle particle morphology.

8. The method of claim 7, wherein the precursor material comprises a mixture of $K_2CO_3$ powder, $Na_2CO_3$ powder, $Li_2CO_3$ powder, and $Nb_2O_5$ powder.

9. The method of claim 7, wherein the first calcination step includes calcining the precursor material at a temperature of about 1000° C. for about 3 hours to obtain the first calcined material and the second calcination step includes calcining the first calcined material from step (i) at a temperature of 900° C. to 950° C., for about 10 hours.

10. The method of claim 9, further comprising cooling the first calcined material from step (i) to room temperature prior to performing the second calcination step.

11. The method of claim 8, wherein the second calcination step includes calcining the first calcined material from step (i) at a temperature of 950° C.

12. The method of claim 7, having a particle size distribution $d_{10}(\mu m)$ of 1.5 to 2, $d_{50}(\mu m)$ of 3.5 to 4, and/or $d_{90}(\mu m)$ of 9 to 10.

13. The method of claim 8, wherein the first calcination temperature is below the sintering temperature of the alkali metals of the precursor material, but promotes formation of a crystalline ceramic structure with a single crystalline phase.

* * * * *